United States Patent [19]

Ikeda et al.

[11] 4,106,943

[45] Aug. 15, 1978

[54] PHOTOSENSITIVE CROSS-LINKABLE AZIDE CONTAINING POLYMERIC COMPOSITION

[75] Inventors: Hiroharu Ikeda; Seiji Aotani; Yoshiyuki Harita, all of Yokohama, Japan

[73] Assignee: Japan Synthetic Rubber Co., Ltd., Tokyo, Japan

[21] Appl. No.: 731,606

[22] Filed: Oct. 13, 1976

Related U.S. Application Data

[63] Continuation-in-part of Ser. No. 506,140, Sep. 16, 1974, abandoned.

[30] Foreign Application Priority Data

Sep. 27, 1973 [JP] Japan .................................. 48-108753

[51] Int. Cl.$^2$ ............................ G03C 1/70; G03C 1/52
[52] U.S. Cl. ..................................... 96/115 R; 96/33; 96/35.1; 96/36; 96/36.2; 96/75; 96/91 N; 204/159.14; 204/159.15; 204/159.23; 204/159.18
[58] Field of Search ............... 96/91 N, 115 R, 115 P, 96/35.1, 33; 204/159.14, 159.15, 159.22, 159.23, 159.18

[56] References Cited

U.S. PATENT DOCUMENTS

| | | | |
|---|---|---|---|
| 2,852,379 | 9/1958 | Hepher et al. ........................ | 96/91 N |
| 3,467,630 | 9/1969 | Danhauser et al. ................ | 96/115 R |
| 3,554,886 | 1/1971 | Colomb et al. .................. | 204/159.14 |
| 3,615,628 | 10/1971 | Mench et al. ........................ | 96/86 P |
| 3,622,482 | 11/1971 | Trecker et al. .................. | 204/159.14 |
| 3,650,669 | 3/1972 | Osborn et al. ................... | 204/159.22 |
| 3,669,662 | 6/1972 | Agnihotri ............................ | 96/91 N |
| 3,711,287 | 1/1973 | Dunham et al. ..................... | 96/91 N |
| 3,763,118 | 10/1973 | Ulrich et al. ......................... | 96/91 N |
| 3,836,509 | 9/1974 | Octave et al. ................... | 204/159.14 |
| 3,984,250 | 10/1976 | Holstead et al. ..................... | 96/91 N |

FOREIGN PATENT DOCUMENTS 1,205,566  9/1970  United Kingdom .................. 96/115 R

OTHER PUBLICATIONS

*Encylopedia of Polymer Science & Technology*, J. Wiley & Sons, vol. 2, 19, pp. 373–378.
Moreau, W. M., *IBM Tech. Discl. Bulletin*, vol. 13, No. 3, p. 797 8/1970.
*Research Disclosure*, 10/1972, pp. 26–27.
Kosar, J., "Light–Sensitive Systems," J. Wiley & Sons, 1965, pp. 330–336.

*Primary Examiner*—Charles L. Bowers, Jr.
*Attorney, Agent, or Firm*—Ladas, Parry, Von Gehr, Goldsmith & Deschamps

[57] ABSTRACT

An organic solvent- or water-developable photosensitive composition consisting essentially of a ring-opened polymer or copolymer of at least one norbornene derivative having at least one substituent selected from the group consisting of ester groups, nitrile groups, carboxyl groups, amide groups, imide groups, hydroxyl groups, halogens and carboxylic acid anhydride groups, or a ring-opened copolymer of at least one said norbornene derivative and at least one cycloolefin other than cyclohexene, or a hydrolysis product of said ring-opened polymer or copolymer and a photosensitive crosslinking agent or photosensitizer soluble in organic solvents or water. The above photosensitive composition is excellent in sensitivity, adhesion and stability.

5 Claims, No Drawings

PHOTOSENSITIVE CROSS-LINKABLE AZIDE CONTAINING POLYMERIC COMPOSITION

CROSS-REFERENCES TO RELATED APPLICATIONS

This is a continuation-in-part of application Ser. No. 506,140, filed on Sept. 16, 1974, now abandoned.

This invention relates to a photosensitive composition excellent in sensitivity, adhesion and stability which contains a ring-opened polymer or copolymer of a norbornene derivative having a polar substituent.

As organic solvent-developable, photosensitive materials, there have heretofore been known combinations of high polymers such as natural rubbers, diene rubbers or cyclized rubbers with photosensitive crosslinking agent such as 4,4'-diazidochalocone, while as water-developable, photosensitive materials, combinations of polyvinyl alcohols with potassium bichromate.

These photosensitive materials, however, have had such drawbacks that they are not sufficient in sensitivity, and solutions thereof are not satisfactory in viscosity and stability and cannot be formed into films having a high adhesion to supports.

Generally, easiness in formation of a photosensitive film is dominated by the viscosity of the high polymer solution used to form the film, and easiness in development of the film with a solvent is dominated by the solubility of the high polymer. Further, the properties of the film are influenced by the homogeneity and stability of the photosensitive material solution used.

Taking the above-mentioned points into consideration, the present inventors have made extensive studies to find a photosensitive composition which does not gel during preparation, is homogeneous, is high in solubility in organic solvents or water, and is excellent in sensitivity and stability.

An object of the present invention is to provide a novel photosensitive composition.

Another object of the invention is to provide an organic solvent- or water-developable, photosensitive composition.

A further object of the invention is to provide a photosensitive composition excellent in sensitivity, adhesion and stability.

Other objects and advantages of the invention will become apparent from the following description.

In according with the present invention, there is provided an organic solvent- or water-developable, photosensitive composition consisting essentially of a ring-opened polymer or copolymer of at least one norbornene derivative having at least one substituent selected from the group consisting of ester groups, nitrile groups, carboxyl groups, amide groups, imide groups, hydroxyl groups, halogens and carboxylic acid anhydride groups, or a ring-opened copolymer of at least one said norbornene derivative and at least one cycloolefin other than cyclohexene or a hydrolysis product of said ring-opened polymer or copolymer, and a photosensitive crosslinking agent or photosensitizer soluble in organic solvents or water.

The term "ring-opened polymer" or "ring-opened copolymer" used herein and the claims attached hereto means polymer or copolymer obtained by ring-opening polymerization.

The norbornene derivative used in the present invention is a compound represented by the general formula,

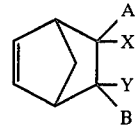

wherein X and Y are independently hydrogen, a saturated or unsaturated hydrocarbon group having up to 10 carbon atoms, preferably up to 6 carbon atoms, $-(CH_2)_nCOOR^1$, $-(CH_2)_nOCOR^1$, $-(CH_2)_nCN$, $-(CH_2)_nCONR^2R^3$ or $-(CH_2)_nZ$, or X and Y may, when taken together, form

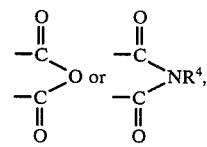

at least one of said X and Y being a group other than the hydrogen and the hydrocarbon group; $R^1$, $R^2$, $R^3$ and $R^4$ are independently hydrogen or a saturated or unsaturated hydrocarbon group having up to 20 carbon atoms, preferably up to 8 carbon atoms, Z is a hydroxyl group or a halogen, and n is an integer of 0 to 10, preferably 0 or 1; and A and B are independently hydrogen or a saturated or unsaturated hydrocarbon group having up to 10 carbon atoms, preferably up to 6 carbon atoms. Preferable substituents of the norbornene derivative are ester, carbosyl, nitrile, amide and anhydride groups. Concrete examples of the norbornene derivative include methyl 5-norbornene-2-carboxylate, ethyl 5-norbornene-2-carboxylate phenyl 5-norbornene-2-carboxylate, methyl 2-methyl-5-norbornene-2-carboxylate, butyl 3-phenyl-5-norbornene-2-carboxylate, dimethyl 5-norbornene-2,3-dicarboxylate, cyclohexyl 5-norbornene-2-carboxylate allyl 5-norborne-2-carboxylate, 5-norbornene-2-yl acetate, 5-norbornene-2-carboxylic acid, 2-methyl-5-norbornene-2-carboxylic acid, 5-norbornene-2,3-dicarboxylic acid, 5-norbornene-2-nitrile, 3-methyl-5-norbornene-2-nitrile, 2,3-dimethyl-5-norbornene-2,3-dinitrile, 5-norbornene-2-carboxylic acid amide, N-methyl-5-norbornene-2-carboxylic acid amide, N,N-dimethyl-5-norbornene-2-carboxylic acid amide, N,N-diethyl-5-norbornene-2-carboxylic acid amide, N,N-dimethyl-2-methyl-5-norbornene-2,3-dicarboxylic acid diamide, 5-norbornene-2,3-dicarboxylic acid anhydride, 2,3-dimethyl-5-norbornene-2,3-dicarboxylic acid anhydride, 5-norbornene-2,3-dicarboxylic acid imide, N-phenyl-2-methyl-5-norbornene-2,3-dicarboxylic acid imide, 5-norbornene-2-ol, 5-hydroxymethyl-2-norbornene, 5,6-dihydroxymethyl-2-norbornene, 5-chloro-2-norbornene, 6-methyl-5-bromo-2-norbornene, and mixtures thereof, though these are not limitative. It is of course possible to use in some cases a tetracyclic compound represented by the general formula.

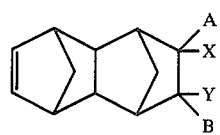

wherein A, B, X and Y are as defined above.

The cycloolefin other than cyclohexene used 25 in the present invention have preferably 4 to 20 carbon atoms, more preferably 4 to 12 carbon atoms, and includes cyclobutene, cyclopentene, cyclooctene, 1,5-cyclooctadiene, 1,5,9-cyclododecatriene, norbornene and 5-methyl-norbornene.

The molar ratio of norbornene derivative to cycloolefin is from 100 : 0 to 10 : 90, preferably from 100 : 0 to 20 : 80. If the proportion of the cycloolefin exceeds 90 mole percent, the resulting photosensitive composition becomes insufficient in sensitivity and the effect of the present invention cannot sufficiently be accomplished.

The ring-opened polymer and copolymer used in this invention are prepared by the following method: A norbornene derivative alone or with a cycloolefin is dissolved in a halogenated hydrocarbon or a hydrocarbon in a predetermined concentration under a nitrogen atmosphere, and to the resulting solution are added as a catalyst at least one compound selected from the group consisting of compounds of W, Mo, Re and Ta and at least one compound selected from the group consisting of organometallic compounds of metals of Groups Ia, IIa, IIb, IIIa, IVa and IVb of the Deming Periodic Table and hydrides of the metals, and if necessary, a compound selected as a third catalyst component, and the resulting mixture is subjected to reaction at a predetermined temperature for a predetermined period of time to obtain the ring-opened polymer or copolymer.

Specifically, U.S. Pat. Nos. 3,856,758 and 3,859,265 disclose the ring-opening polymerization of these norbornene derivatives, and the descriptions of said U.S. patents are incorporated herein by reference. Further, U.S. patent applications Ser. Nos. 505,173, filed Sept. 11, 1974, now abandoned, and 512,790 filed Oct. 7, 1974, now U.S. Pat. No. 4,068,063, disclose and claim a method for producing the ring-opened polymer and copolymer of norbornene derivatives used in this invention, and the descriptions of said U.S. applications are incorporated herein by reference.

In this invention, there may be used a ring-opened polymer or copolymer prepared by any production method.

The ring-opened polymer of norbornene derivative has a structure represented by the general formula,

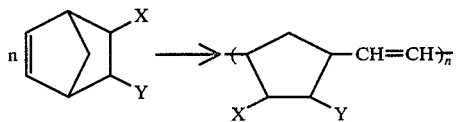

The method for polymerization of methyl 5-norborne-2-carboxylate effected in order to prepare the ring-opened polymer used in Example 1 which appears hereinafter is as follows:

To a 100 ml glass ampoule which has been sufficiently purged with dry nitrogen were added 40 ml of chlorobenzene as a solvent and 15.2 g (100 mmol.) of methyl 5-norbornene-2-carboxylate in this order, and 2 ml of a $WCl_6$ solution in chlorobenzene (0.05 mol./l) was then added thereto. Finally, 2.5 ml of an $Al(C_2H_5)_3$ solution in chlorobenzene (0.1 mol./l) was added to the glass ampoule, after which the ampoule was closed, and reaction was effected at 25° C for 4 hours. After the completion of the reaction, the catalyst was deactivated with a small amount of methanol, and the reaction liquid was poured into a large amount of methanol containing an antioxidant to coagulate the resulting polymer, whereby a white polymer was obtained in a yield of 92%.

Ring-opened polymers and copolymers of other norbornene derivatives can be obtained in the same manner as mentioned above.

The said ring-opened polymer or copolymer is a thermoplastic resin excellent in tensile strength and impact resistance, and is soluble in organic solvents. In case an organic solvent-developable, photosensitive composition is desired to be obtained, the ring-opened polymer or copolymer is used in the form of a solution in at least one solvent selected from the group consisting of aromatic hydrocarbons such as benzene, toluene and xylene; halogenated aromatic hydrocarbons such as chlorobenzene, dichlorobenzene and α-chloronaphthalene; halogenated aliphatic hydrocarbons such as methylene chloride and chloroform; esters such as methyl acetate, ethyl acetate and ethylene carbonate; and cyclic ethers such as dioxane and tetrahydrofuran. In case a water-developable, photosensitive composition is desired to be obtained, the ring-opened polymer or copolymer having hydroxyl and/or carboxyl groups is used as such, or the ring-opened polymer or copolymer having substituents other than hydroxyl and carboxyl groups is hydrolyzed with an alkali or acid to that of the carboxylate or carboxylic acid type. The hydrolysis product of the ring-opened polymer or copolymer of norbornene derivative can be obtained by dissolving the ring-opened polymer or copolymer in an organic solvent miscible with water, such as tetrahydrofuran, acetone, dioxane, ethanol or the like, adding an aqueous solution of an acid or a base to the resulting solution, and then subjecting the solution to reaction with stirring by, if necessary, applying heat thereto. For example, when a ring-opened polymer of methyl 5-norbornene-2-carboxylate is hydrolyzed with a base, the polymer is converted into a carboxylate type polymer, and when the polymer is hydrolyzed with an acid, it is converted into a carboxylic acid type polymer. The carboxylate type polymer or copolymer is dissolved in water, while the carboxylic acid type polymer or copolymer is dissolved in an aqueous alkali solution. In this case, the molar ratio of norbornene derivative to cycloolefin is desirably from 100 : 0 to 50 : 50.

The ring-opened polymer or copolymer is prepared by homogeneous solution polymerization, and hence is obtained in an extremely homogeneous state without requiring any particular purification.

The azide type photosensitive crosslinking agent used in this invention is not particularly restricted, and includes, for example, 4,4'-diazidostilbene, p-phenylenebisazide, 4,4'-diazidobenzophenone, 4,4'-diazidodiphenylmethane, 4,4'-diazidochalocone, 2,6-bis(4'-azidobenzal)cyclohexanone, 4,4'-diazidodiphenyl, 4,4'-diazido-3,3'-dimethyldiphenyl, 4,4'-diazidostilbene-α-carboxylic acid, and 2,7-diazidofluorene.

The azide type photosensitive crosslinking agent added to the polymer generates a radical owing to the decomposition of the azido group when exposed to light, whereby the polymer portion exposed to light is crosslinked and becomes insoluble. Therefore, when the exposed polymer is developed with a solvent, the exposed polymer portion remains as a resist image, whereby an image is formed.

In this invention, the photosensitive composition of the ring-opened polymer or copolymer of norbornene derivative is prepared by the following method: The ring-opened polymer or copolymer of norbornene derivative is dissolved in an organic solvent in a pre-determined concentration, and the azide type photosensitive crosslinking agent is added thereto in an amount of 0.01 to 5% by weight based on the weight of the polymer or copolymer to prepare the photosensitive composition solution. This solution is applied to a plate of a metal such as copper, zinc, aluminum or the like, or a silicone wafer and then dried to form a thin film on the substrate. When this is exposed to light, crosslinking reaction takes place, whereby only the exposed portion becomes insoluble in an solvent owing to the crosslinking reaction. Therefore, when the thin film is exposed to light through a pattern, the exposed portion remains as a resist image when developed with a solvent, whereby an image is formed.

When a water-soluble ring-opened polymer is used, a photosensitive composition can be prepared in a similar manner.

Films formed from the photosensitive composition of the present invention are excellent in adhesion to supports and excellent in impact resistance and strength. Accordingly, the films are not peeled off or torn off even by a strong shock at the time of development, and thus images high in resolving power can be obtained. Furthermore, the thus obtained images are excellent in acid resistance and alkali resistance, and hence can successfully be put into various uses such as, for example, resists for printed circuits, resists for production of name plates using an alkali etching solution, thin resists for integrated circuits, and photoresists for plate making.

The present invention is illustrated in more detail below with reference to Examples, but the Examples are by way of illustration and not by way of limitation.

EXAMPLE 1

To a solution of 0.4 g. of a polymer of methyl 5-norbornene-2-carboxylate in 7.6 g. of toluene was added 12 mg. of 2,6-bis(4'-azidobenzal)cyclohexanone to form a homogeneous solution. This solution was applied to a commercially available ungrained aluminum plate, after which the solvent was removed by evaporation to form a thin film on the plate. The thin film was then exposed for 10 seconds through Step Tablet No. 2 (manufactured by Eastman Kodak Co.) placed on the thin film by use of an exposure device Model P-11 (manufactured by Dai-Nippon Screen Manufacturing Co.). Subsequently, the aluminum plate was immersed in a developer toluene to dissolve and remove uncured portion, and the number of resist-forming steps was determined. The results obtained were as shown in Table 1.

EXAMPLE 2

A solution in toluene of a ring-opened copolymer of (a) methyl 5-norbornene-2-carboxylate and (b) 5-norbornene-2-nitrile (molar ratio of (a) : (b) = 6.5 : 3.5) was subjected to measurement of sensitivity in the same manner as in Example 1. The results obtained were as shown in Table 1.

EXAMPLE 3

A solution in toluene of a ring-opened polymer of N,N-dimethyl-5-norbornene-2-carboxylic acid amide was subjected to measurement of sensitivity in the same manner as in Example 1. The results obtained were as shown in Table 1.

EXAMPLE 4

A solution in toluene of a ring-opened polymer of dimethyl 5-norbornene 2,3-dicarboxylate was subjected to measurement of sensitivity in the same manner as in Example 1. The results obtained were as shown in Table 1.

EXAMPLE 5

A solution in acetone of a ring-opened polymer of 5-norbornene-2-carboxylic acid prepared by 100% hydrolyzing the ring-opened polymer used in Example 1 with hydrochloric acid was subjected to measurement of sensitivity in the same manner as in Example 1, except that the developer was replaced by a 0.1N aqueous NaOH solution. The results obtained were as shown in Table 1.

EXAMPLE 6

A solution in chlorobenzene of a ring-opened copolymer of (a) methyl 5-norbornene-2-carboxylate and (b) cyclopentene (molar ratio of (a) : (b) = 8 : 2) was subjected to measurement of sensitivity in the same manner as in Example 1. The results obtained were as shown in Table 1.

EXAMPLE 7

A solution in toluene of a ring-opened copolymer of (a) 5-norbornene-2,3-dicarboxylic anhydride and (b) cyclooctene (molar ratio of (a) : (b) = 2 : 8) was subjected to measurement of sensitivity in the same manner as in Example 1. The results obtained were as shown in Table 1.

Table 1

| Example | Number of resist forming steps | Specific sensitivity[2] |
|---|---|---|
| 1 | 8 | 7.51 |
| 2 | 6 | 2.00 |
| 3 | 7 | 3.75 |
| 4 | 6 | 2.41 |
| 5 | 7 | 3.89 |
| 6 | 6 | 3.89 |
| 7 | 9 | 10.77 |
| Comparative[1] Example | 6 | — |

Notes:
[1]KTFR produced by Eastman Kodak Co.
[2]Calculated from the equation described in Collection of These of Japan Printing Society, 6 (11), 65–68 (1963).

EXAMPLE 8

The ring-opened polymer solution of Example 6 was coated on an ungrained aluminum plate of 0.2 mm. in thickness, exposed for 120 seconds through a negative film by use of the same device as in Example 1, and then developed in the same manner as in Example 1, whereby a sharp positive image was formed. Subsequently, the aluminum plate with the printed positive image was etched for 4 seconds in 2.5N hydrochloric acid containing 0.5% by weight of copper sulfate. Even after etching, the resin film showed sufficient adhesion and resistance to ethcing. Thus, it was found that the photosensitive composition of the present invention is higher in adhesion force than the commercially available product used in the Comparative Example.

EXAMPLE 9

A ring-opened polymer of 5-norbornene-2-nitrile was dissolved in acetone, and the photosensitivity thereof was measured in the same manner as in Example 1, except that acetone was used as a developing liquid. The number of resist-forming steps was 8 and the specific sensitivity was 7.02.

EXAMPLE 10

A copolymer of (a) methyl 5-norbornene-2-carboxylate and (b) norbornene (the molar ratio of (a)/(b) = 5/5) was dissolved in toluene, and the photosensitivity thereof was measured in the same manner as in Example 1. The number of resist-forming steps was 7 and the specific sensitivity was 4.12.

EXAMPLES 11 to 18

The same procedure as in Example 1 was repeated, except that a compound as shown in Table 2 was substituted for the 2,6-bis(4'-azidobenzal)cyclohexanone as the azide type photosensitive crosslinking agent to obtain the results shown in Table 2.

Table 2

| Example No. | Azide type photosensitive crosslinking agent | Number of resist-forming steps | Specific sensitivity |
|---|---|---|---|
| 11 | 4,4'-Diazidostilbene | 6 | 2.12 |
| 12 | p-Phenylenebisazide | 6 | 2.56 |
| 13 | 4,4'-Diazidobenzophenone | 7 | 4.00 |
| 14 | 4,4'-Diazidochalcone | 8 | 5.91 |
| 15 | 4,4'-Diazidostilbene-α-carboxylic acid | 7 | 3.89 |
| 16 | 4,4'-Diazidodiphenyl | 6 | 2.83 |
| 17 | 4,4'-Diazido-3,3'-dimethyldiphenyl | 7 | 4.31 |
| 18 | 2,7-Diazidofluorene | 7 | 4.11 |

What is claimed is:

1. A photosensitive composition consisting essentially of (1) a ring-opened polymer or copolymer of at least one norbornene derivative selected from the group consisting of methyl 5-norbornene-2-carboxylate, dimethyl 5-norbornene-2,3-dicarboxylate, N,N-dimethyl-5-norbornene-2-carboxylic acid amide, 5-norborne-2-nitrile and 5-norbornene-2,3-dicarboxylic anhydride, or a ring-opened copolymer of at least one said norbornene derivative and at least one cyclo-olefin selected from the group consisting of cyclopentene, cyclooctene and norbornene, wherein the molar ratio of the norbornene derivative to the cycloolefin in the ring-opened copolymer is from 100 : 0 to 10 : 90, wherein said ring-opened polymer of said norbornene derivative has a structure comprising units of the general formula:

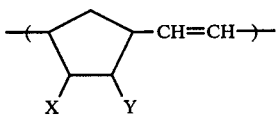

in which X and Y represent the location of said 2- and 3- position substituents of said norbornene derivative,
and wherein said ring-opened polymer or copolymer is thermoplastic and is soluble in organic solvents or water; and (2) an azide type photosensitive crosslinking agent in an amount of 0.01 to 5% by weight based on the weight of said polymer or copolymer.

2. A photosensitive composition according to claim 1, wherein the ring-opened polymer or copolymer is selected from the group consisting of a ring-opened polymer of methyl 5-norbornene-2-carboxylate, a ring-opened copolymer of methyl 5-norbornene-2-carboxylate and 5-norbornene-2-nitrile, a ring-opened polymer of N,N-dimethyl-5-norbornene-2-carboxylic acid amide, a ring-opened polymer of dimethyl 5-norbornene-2,3-dicarboxylate, a ring-opened copolymer of methyl 5-norbornene-2-carboxylate and cylopentene, a ring-opened copolymer of 5-norbornene-2,3-dicarboxylic anhydride and cyclooctene, a ring-opened polymer of 5-norbornene-2-nitrile and a ring-opened copolymer of methyl 5-norbornene-2-carboxylate and norbornene.

3. A photosensitive composition according to claim 1, wherein the azide type photosensitive substance is selected from the group consisting of 4,4'-diazidostilbene, p-phenylenebisazide, 4,4'-diazidobenzophenone, 4,4'-diazidodiphenylmethane, 4,4'-diazidochalcone, 2,6-bis(4'-azidobenzal)cyclohexanone, 4,4'-diazidostilbene-α-carboxylic acid, 4,4'-diazidodiphenyl, 4,4'-diazido-3,3'-dimethyldiphenyl and 2,7-diazidofluorene.

4. A photosensitive composition consisting of (1) a ring-opened polymer of methyl 5-norbornene-2-carboxylate, wherein said ring-opened polymer has a structure comprising units of the general formula:

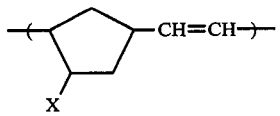

in which X represents the location of said 2- position substituent of said norbornene derivative,
and wherein said ring-opened polymer is thermoplastic and is soluble in organic solvents; and (2) 2,6-bis(4'-azidobenzal)cyclohexanone in an amount of 0.01 to 5% by weight based on the weight of said polymer.

5. A water-developable photosensitive composition consisting essentially of (1) a hydrolysis product of a ring-opened polymer of methyl 5-norbornene-2-carboxylate, wherein said ring-opened polymer has a structure comprising units of the general formula:

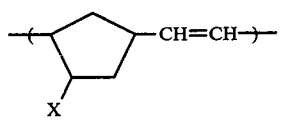

in which X represents the location of said 2- position substituent of said norborne derivative,
and wherein said hydrolyzed ring-opened polymer is thermoplastic and is soluble in water; and (2) an azide type photosensitive crosslinking agent in an amount of 0.01 to 5% by weight based on the weight of said polymer.

* * * * *